(12) United States Patent
Huang et al.

(10) Patent No.: US 11,927,604 B2
(45) Date of Patent: Mar. 12, 2024

(54) MULTI-SITE CONCURRENT WAFER PROBE MAGNETIC CIRCUIT TESTING

(71) Applicant: Texas Instruments Incorporated, Dallas, TX (US)

(72) Inventors: Xinkun Huang, McKinney, TX (US); Dok Won Lee, Mountain View, CA (US); Christopher Michael Ledbetter, Farmers Branch, TX (US); Bret Alan Dahl, McKinney, TX (US); Roy Deidrick Solomon, Melissa, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 17/313,657

(22) Filed: May 6, 2021

(65) Prior Publication Data

US 2021/0356497 A1   Nov. 18, 2021

Related U.S. Application Data

(60) Provisional application No. 63/025,546, filed on May 15, 2020.

(51) Int. Cl.
*G01R 33/12* (2006.01)
*G01R 1/04* (2006.01)
(Continued)

(52) U.S. Cl.
CPC ....... *G01R 1/07342* (2013.01); *G01R 1/0491* (2013.01); *G01R 33/072* (2013.01)

(58) Field of Classification Search
CPC .............. G01R 1/0491; G01R 1/07342; G01R 31/2868; G01R 33/0017; G01R 33/0094; G01R 33/038; G01R 33/07; G01R 33/072; G01R 33/12; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00;
(Continued)

(56) References Cited

U.S. PATENT DOCUMENTS

2018/0130849 A1   10/2018   Lee et al.
2019/0033344 A1 *  1/2019   Funk ........................ G01R 1/07
(Continued)

FOREIGN PATENT DOCUMENTS

AT            521009 B1  * 10/2019

*Primary Examiner* — Feba Pothen
*Assistant Examiner* — Brent J Andrews
(74) *Attorney, Agent, or Firm* — Ronald O. Neerings; Frank D. Cimino

(57) ABSTRACT

A wafer probe test system having a probe card with a probe head, a rotary magnet, a magnetic sensor positioned to sense the magnetic field of the rotary magnet and a controller coupled to the probe card, where the probe head has probe needles to engage features of test sites of a wafer in a wafer plane of orthogonal first and second directions, and the rotary magnet is rotatable around an axis of a third direction to provide a magnetic field to the wafer, in which the controller includes a model of magnetic flux density in the first, second and third directions at the respective test sites of the wafer as a function of a rotational angle of the rotary magnet, a probe needle height along the third direction and a measured magnetic flux density of the magnetic sensor.

22 Claims, 13 Drawing Sheets

(51) Int. Cl.
  *G01R 1/073* (2006.01)
  *G01R 33/07* (2006.01)
(58) Field of Classification Search
  CPC ........ G01R 23/00; G01R 25/00; G01R 27/00;
       G01R 29/00; G01R 31/00; G01R 33/00;
       G01R 35/00
  See application file for complete search history.

(56) References Cited

U.S. PATENT DOCUMENTS

2019/0137543 A1\* 5/2019 Eo ........................ G01R 1/0491
2019/0267539 A1   8/2019 Green et al.

\* cited by examiner

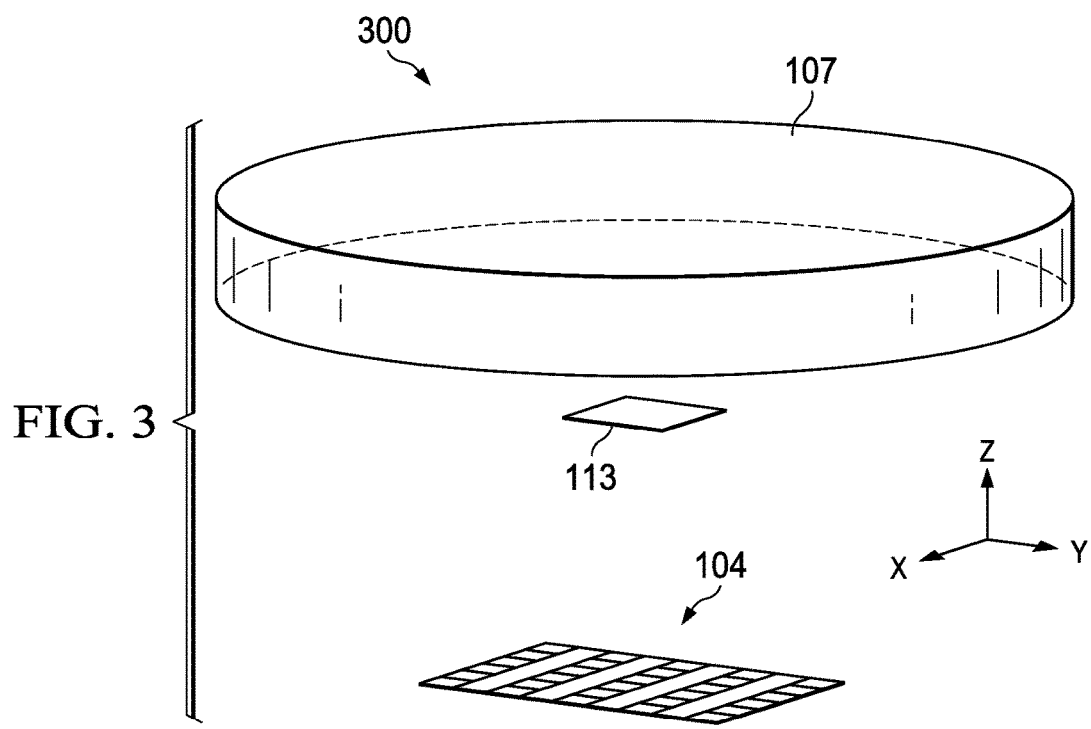
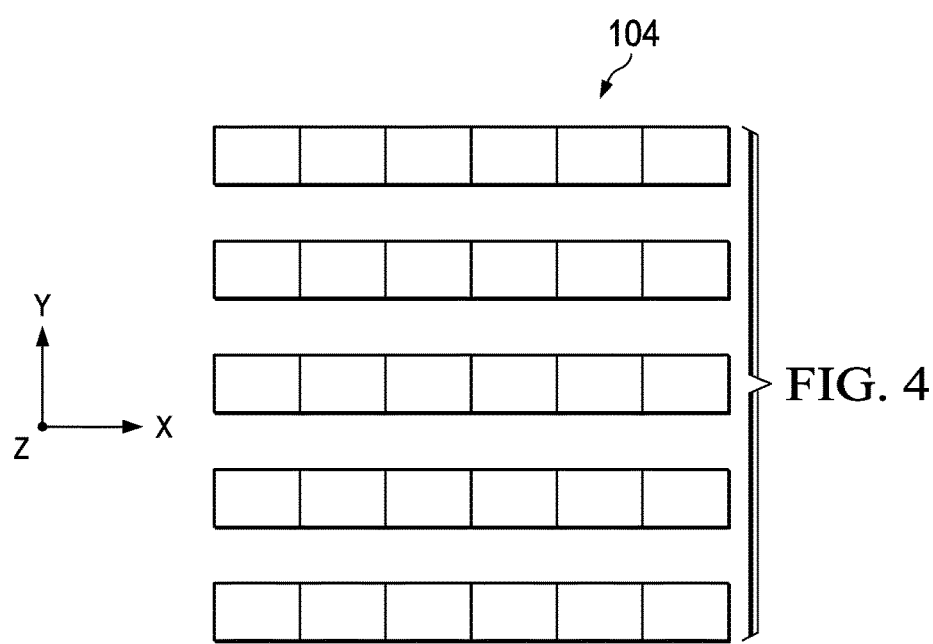

MULTI-SITE CONCURRENT WAFER PROBE MAGNETIC CIRCUIT TESTING

CROSS-REFERENCE TO RELATED APPLICATION

This application claims priority to, and the benefit of, U.S. provisional patent application No. 63/025,546, entitled "Inline Manufacturing Method to Probe Test Hall Effect Sensor Devices for 30 Sites", and filed on May 15, 2020, the entirety of which is hereby incorporated by reference.

BACKGROUND

Testing magnetic devices during manufacturing is beneficial to assess product performance prior to shipment, and wafer probe testing can save packaging costs for magnetic circuits that do not exhibit acceptable performance prior to die singulation. However, testing magnetic circuit performance at the wafer level requires testing in a wafer probe system provided with a controlled magnetic field, such as a rotating permanent magnet. Wafer probe testing is costly in terms of manufacturing time, and the test time can be reduced by testing magnetic circuits of multiple die areas concurrently in a given touch-down, as well as by performing the testing during less than a full rotation of the magnet. However, variations in the generated magnetic field at the different concurrently probed sites and variations with magnet rotational angle affect the accuracy of the test results. In addition, the applied magnetic field can vary with temperature, probe needle height and calibration readings using in-line or on-board magnetic sensors can vary. Moreover, variations in the magnet can affect test results.

SUMMARY

In one aspect, a wafer probe test system includes a probe card with a probe head, a rotary magnet, a magnetic sensor positioned to sense the magnetic field of the rotary magnet and a controller coupled to the probe card. The probe head has probe needles to engage features of test sites of a wafer in a wafer plane of orthogonal first and second directions, and the rotary magnet is rotatable around an axis of an orthogonal third direction to provide a magnetic field to the wafer. The controller includes a model of magnetic flux density in the first, second and third directions at the respective test sites of the wafer as a function of a rotational angle of the rotary magnet, a probe needle height along the third direction and a measured magnetic flux density of the magnetic sensor.

In another aspect, a method of manufacturing an electronic device includes initializing a wafer probe test system to test a wafer that is positioned in a wafer plane of orthogonal first and second directions. The initialization includes measuring a probe needle height along a third direction that is orthogonal to the first and second directions and measuring a magnetic field of a rotary magnet rotating about an axis along the third direction at different rotational angles using a magnetic sensor of the wafer probe test system. The method further includes testing magnetic sensing performance of circuits of respective test sites of the wafer while the rotary magnet rotates according to a model of magnetic flux density in the first, second and third directions at the respective test sites of the wafer as a function of the rotational angle of the rotary magnet, the probe needle height and the measured magnetic flux density of the magnetic sensor.

In a further aspect, a computer-readable medium has computer-executable instructions which, when executed by a processor cause the processor to initialize a wafer probe test system to test a wafer that is positioned in a wafer plane of orthogonal first and second directions, including: measuring a probe needle height along a third direction that is orthogonal to the first and second directions, and measuring a magnetic field of a rotary magnet rotating about an axis along the third direction at different rotational angles using a magnetic sensor of the wafer probe test system. The computer-readable medium also has computer-executable instructions which, when executed by a processor cause the processor to test magnetic sensing performance of circuits of respective test sites of the wafer while the rotary magnet rotates according to a model of magnetic flux density in the first, second and third directions at the respective test sites of the wafer as a function of the rotational angle of the rotary magnet, the probe needle height and the measured magnetic flux density of the magnetic sensor.

BRIEF DESCRIPTION OF THE DRAWINGS

FIG. 3 is a simplified perspective view of a modeled wafer probe test system with a rotary magnet, an on-board or in-line magnetic sensor and a multi-site probe head.

FIG. 4 is a partial top plan view of a probed portion of a tested wafer with 30 concurrently probed die areas or probed test sites.

DETAILED DESCRIPTION

Figure 1:
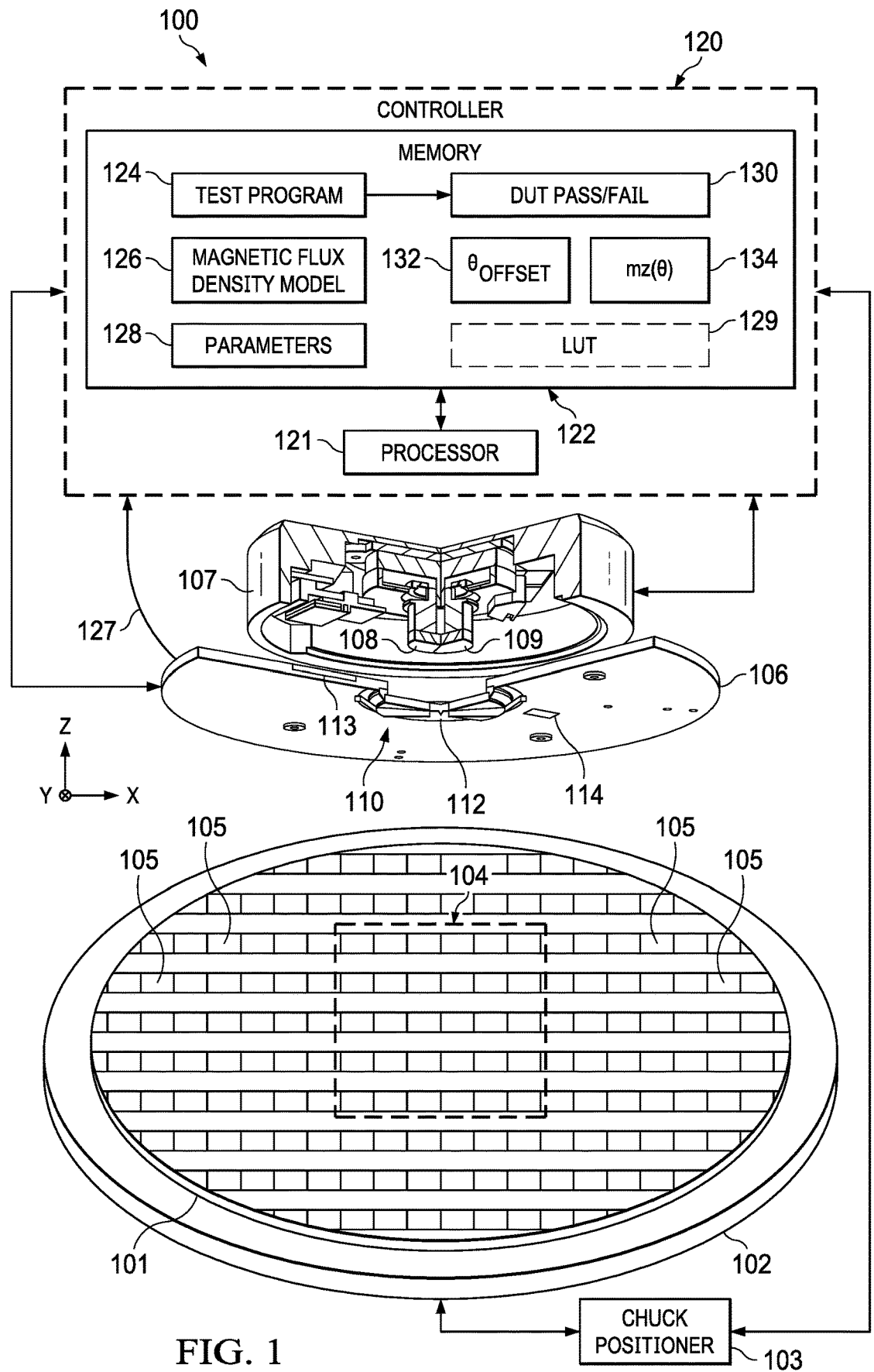
FIG. 1 is a partial perspective view of a wafer probe test system with a magnetic flux density model.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a partial schematic and perspective view of a portion of a wafer probe test system 100 with a magnetic flux density model to mitigate the impact of probe hardware performance variation. The wafer probe test system 100 is adapted to concurrently test multiple concurrently probed test sites of a wafer 101 in a single engagement or touchdown. In particular, the wafer probe test system 100 is configured to test magnetic circuits of individual die areas of a processed wafer 101 supported on or in a wafer chuck 102 in the presence of a magnetic field generated by the system 100 to evaluate one or more performance metrics of the magnetic circuits fabricated on or in the wafer 101. The system 100 includes a chuck positioner 103 as well as loading and unloading apparatus to install and handle a tested wafer 101 in the wafer chuck 102 for wafer-level electrical testing of die locations that correspond to individual prospective dies with associated electronic circuitry. The chuck 102 is adapted or otherwise configured to support the wafer 101 during repositioning and testing. In one example, the chuck positioner 103 is a 3-axis position controller that is operatively coupled to the chuck 102.

The wafer probe test system 100 provides on-board magnetic field generation, on-board magnetic sensing, as well as adaptive model-based magnetic flux density computation to facilitate accurate circuit performance evaluation at wafer probe. In operation in one example, the wafer 101 is held in position by a vacuum feature of the chuck 102 (not shown) and the chuck is positioned to support a selected set or array 104 of 30 sites 105 having individual devices under test (DUTs) of the wafer 101 relative to a probe card 106. The chuck 102 supports the wafer 101 such that a generally planar upper or top side of the wafer 101 is positioned in a wafer plane of a first direction X and an orthogonal second direction Y.

The wafer probe test system 100 provides concurrent multi-site testing of magnetic circuits of the individual test sites 105 of the wafer 101 with on-board magnetic field generation provided by a rotary magnet 107 having a first pole 108 and a second pole 109. The rotary magnet 107 is spaced apart from the probe card 106 along a third direction Z, where the third direction Z is orthogonal to the wafer plane. The rotary magnet 107 provides a magnetic field to the wafer 101 as the magnet 107 and its poles 108 and 109 are rotated around an axis of the third direction Z. In one example, the rotary magnet 107 is detachable. The rotary magnet 107 generates a generally planar magnetic field in the first and second (e.g., X and Y) directions to probe an 8 mm×8 mm array 104 including 30 test sites 105. As discussed further below in connection with FIGS. 11-14, the rotary magnet 107 also generates a magnetic field in the third direction Z, and certain implementations of the wafer probe test system 100 include a band coil to facilitate testing of magnetic circuit response with respect to C-direction magnetic fields.

The probe card 106 in one example is a single or multi-layer printed circuit board (PCB) having a substrate with electrical contacts or solder pads, circuit components soldered to the contacts, and conductive vias and conductive traces for routing electrical signals. The probe card 106 has a probe head 110 mounted to the bottom of the probe card 106. The probe head 110 includes 30 sets of probe needles 112 arranged in the X-Y plane of the probe head 110 as an array that corresponds to the array 104 of 30 test sites 105 and allows concurrent testing of 30 respective circuits of the wafer 101 of the tested wafer 101. The probe needles 112 are configured to engage and make electrical connection to conductive features of a selected array 104 test sites 105 of the wafer 101 located in the wafer X-Y plane when the chuck 102 is positioned to a suitable location beneath the probe card 106. In one example, the probe needles 112 are spring loaded or fixed copper or aluminum pins that mechanically engage to, and form electrical connections to, conductive features on the top side of the processed wafer 101.

The chuck positioner 103 controls a relative position of the chuck 102 and the probe card 106 to engage the conductive probe pins 112 of the probe head 110 to conductive features of the wafer 101 of the selected set of DUTs of the selected array 104 of test sites 105. In another example, a positioner is operatively coupled to probe card 106 to control the relative positions of the probe card 106 and the chuck 102. In another example, a positioner is operatively coupled to both the probe card 106 and the chuck 102 to control the relative positions of the probe card 106 and the chuck 102. The chuck positioner 103 in one example includes mechanical actuators, robotic arms, or the like to control the relative positions of the probe card 106 and the chuck 102 in three-dimensional space (e.g., along the X, Y and/or Z directions in the drawings).

The probe card 106 includes one or more magnetic sensors 113 for in-line or on-board magnetic sensing. In one example, the probe card 106 includes a single magnetic sensor 113 as shown in FIG. 1, also referred to as a calibration sensor. In another example, the probe card 106 includes multiple magnetic sensors 113, for example, arranged in an array to measure magnetic field strength or flux density at multiple locations in an X-Y plane of the probe card 106, and averaging of the sensors readings can be used to filter out noise effects in the system. The magnetic sensor 113 is positioned to sense the magnetic field of the rotary magnet 107 as the rotary magnet rotates during wafer probe testing, as well as during wafer start initialization and initial magnetic modeling of the system 100 as discussed further below. The wafer probe test system 100 also has a camera 114 positioned on the probe card 106 to measure the probe needle height along the third direction Z during wafer start initialization.

The wafer probe test system 100 includes a processor-based controller 120 operatively coupled to the probe card 106. In one example, the controller 120 and the components thereof are implemented in a single processor-based device, such as a microprocessor, microcontroller, FPGA, etc. In another example, or one or more of these are separately implemented in unitary or distributed fashion by two or more processor devices of the wafer probe test system 100. The controller 120 includes a processor 121 and an electronic memory 122 operatively coupled to the processor 121. The electronic memory 122 is a non-transitory computer readable medium that stores data, model parameters and/or a lookup table (LUT) along with computer-executable instructions executable by the processor 121 to perform automated wafer probe testing during powered operation of the system 100. The electronic memory in certain examples is or includes a computer memory, a CD-ROM, floppy disk, flash drive, database, server, computer, etc., which includes computer-executable instructions for performing the methods and functions described herein.

The memory 122 in one example stores computer-executable instructions to implement a wafer probe test program 124, as well as a magnetic flux density model 126 of magnetic flux density in the first, second and third directions X, Y, Z at the respective test sites 105 of the wafer 101 as a function of a rotational angle $\theta$ of the rotary magnet 107, a probe needle height dz along the third direction Z and a measured magnetic flux density of the magnetic sensor 113. In one example, the model 126 is a regression model with parametric equations for flux density and the memory 122 of the controller 120 includes model parameters 128 for magnetic flux density in the first, second and third directions X, Y, Z as a function of the rotational angle $\theta$ of the rotary magnet 107 for each of the respective test sites 105 of the wafer 101. In another implementation the controller 120 implements the model 126 using magnetic model data in a lookup table 129.

The processor 121 executes the instructions of the test program 124 to test magnetic sensing performance of circuits of the respective test sites 105 of the wafer 101 according to the model 126 and a signal 127 from the probe card 106 while the rotary magnet 107 rotates. The test program 124 determines a pass or fail condition 130 of the circuits (devices under test or DUTs) of the respective test sites 105 and stores the pass/fail results 130 in the memory 122. In one example, the test program 124 determines a pass or fail condition 130 of the circuits according to toggle angles at which the respective circuits switch from a first state to a second state in response to the magnetic field of the rotary magnet 107. The memory 122 also stores one or more angular offset values 132 ($\theta_{OFFSET}$) and one or more slope values 134 (mz($\theta$)) determined during wafer start initialization for each successively tested wafer 101. In one example, the model 126 is a function of the angular offset $\theta_{OFFSET}$ and the slope mz($\theta$) determined during the wafer start initialization.

Figure 2:
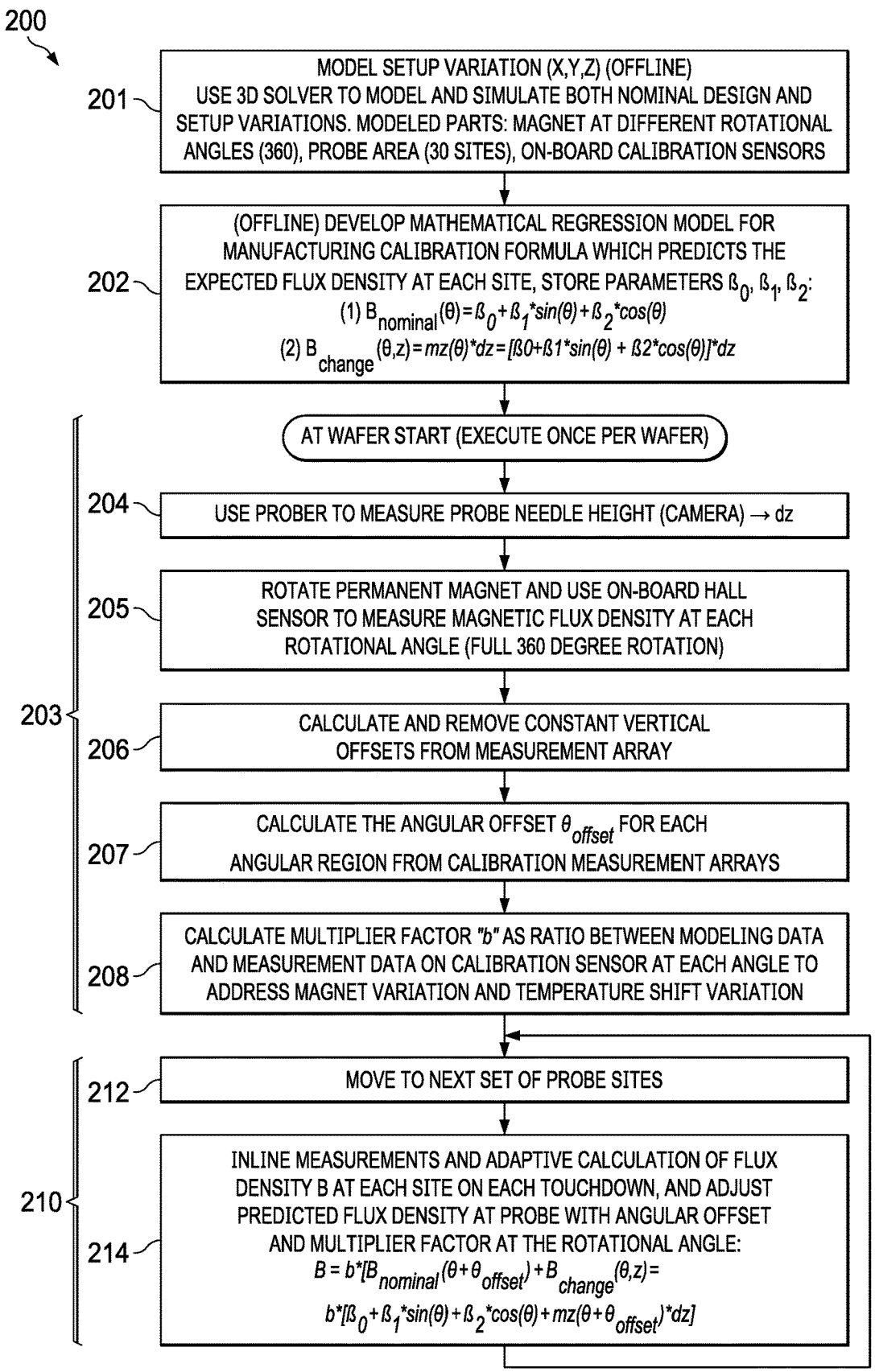
FIG. 2 is a flow diagram of a method of fabricating an electronic device with wafer probe testing using the model and system of FIG. 1.

FIG. 2 shows a method 200 of fabricating an electronic device with wafer probe testing using the model 126 and wafer probe test system 100 of FIG. 1. The fabrication process in one implementation includes wafer processing to form circuits in individual test sites 105 of the wafer 101, followed by wafer probe testing as described further below. The illustrated method 200 includes initial characterization or modeling and simulation of a nominal test set up and setup variations, for example, using a three-dimensional solver at 201. The initial characterization in one example uses the three-dimensional solver to model and simulate both the nominal system design and setup variations, includes modeling of the rotary magnet 107 at different rotational angles $\theta$ (e.g., in increments of 1°), as well as modeling of the probe array area 104 (e.g., 30 test sites 105) and the on-board calibration sensors 113.

The initial characterization is followed by off-line development at 202 of a mathematical regression model 126 for a manufacturing calibration formula that predicts the expected magnetic flux density at each test site 105. In this example, the parameters 128 of the developed regression model 126 are stored in the electronic memory 122 of the wafer probe test system controller 120. Thereafter at 203, a wafer start initialization is performed for each tested wafer 101, and the wafer probe testing of multiple test sites 105 (e.g., an array 104 of 30 test sites 105) is implemented at 210. In one example, the wafer probe testing at 210 is an inline probe process that adaptively calculates the expected flux density B at each test site 105 on each touchdown for concurrently testing 30 test sites 105. The adaptive model-based flux density computation facilitates reliable pass/fail assessment of the circuitry of each individual test site 105 independent of variations in probe hardware. The pass/fail test results 130 are stored in the electronic memory 122. Thereafter, the wafer 101 is singulated, for example, by saw cutting to separate individual test sites 105 into respective semiconductor dies. The singulated semiconductor dies that pass the wafer probe testing at 210 are then packaged to provide integrated circuit products.

The developed mathematical regression model 126 provides a manufacturing calibration formula, which predicts the expected flux density at each site, including characterization of the nominal magnetic flux density $B_{nominal}(\theta) = \beta 0 + \beta 1 \sin(\theta) + \beta 2 \cos(\theta)$ and a magnetic flux density change value $B_{change}(\theta,z) = mz(\theta)*dz = [\beta 0 + \beta 1*\sin(\theta) + \beta 2*\cos(\theta)]*dz$ at each test site 105 of the wafer 101 on each touchdown of the probe card 106, where $\beta 0$, $\beta 1$ and $\beta 2$ are the regression model parameters 128 based on the system characterization at 201, $\theta$ is the rotational angle of the rotary magnet 107, mz is the slope determined off-line as a function of the rotational angle $\theta$, and dz is a probe needle height measured during wafer start initialization using the camera 114.

Figure 8:
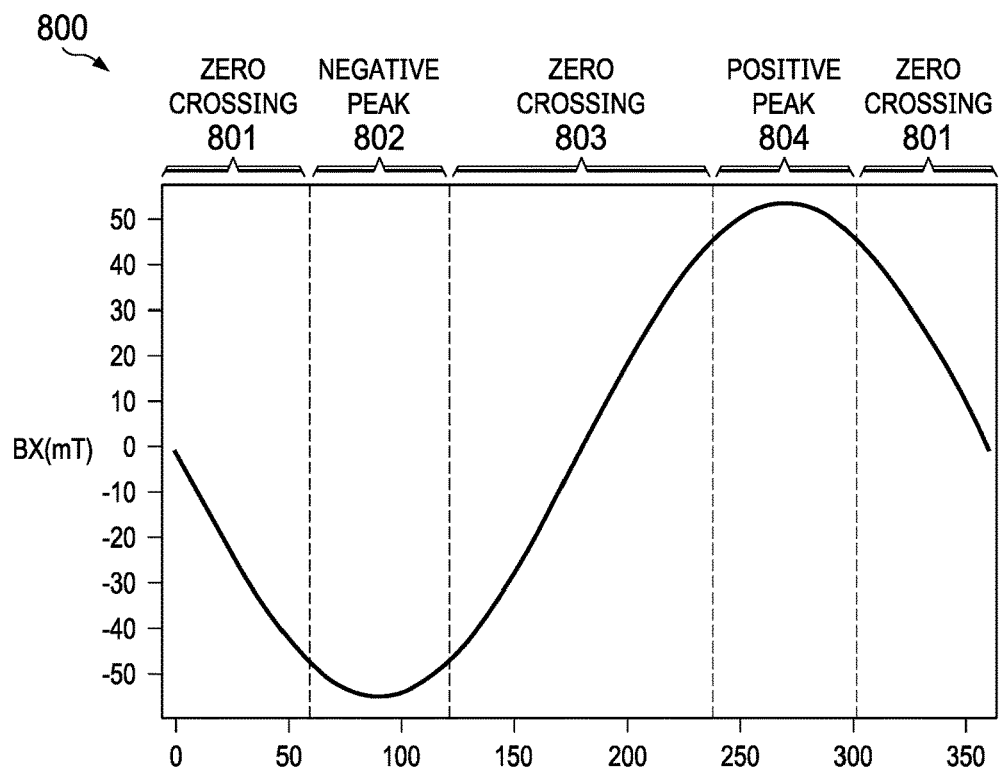
FIG. 8 is a graph of magnetic flux density along the first direction as a function of the rotational angle of the rotary magnet showing example angular offset regions.
Figure 9:
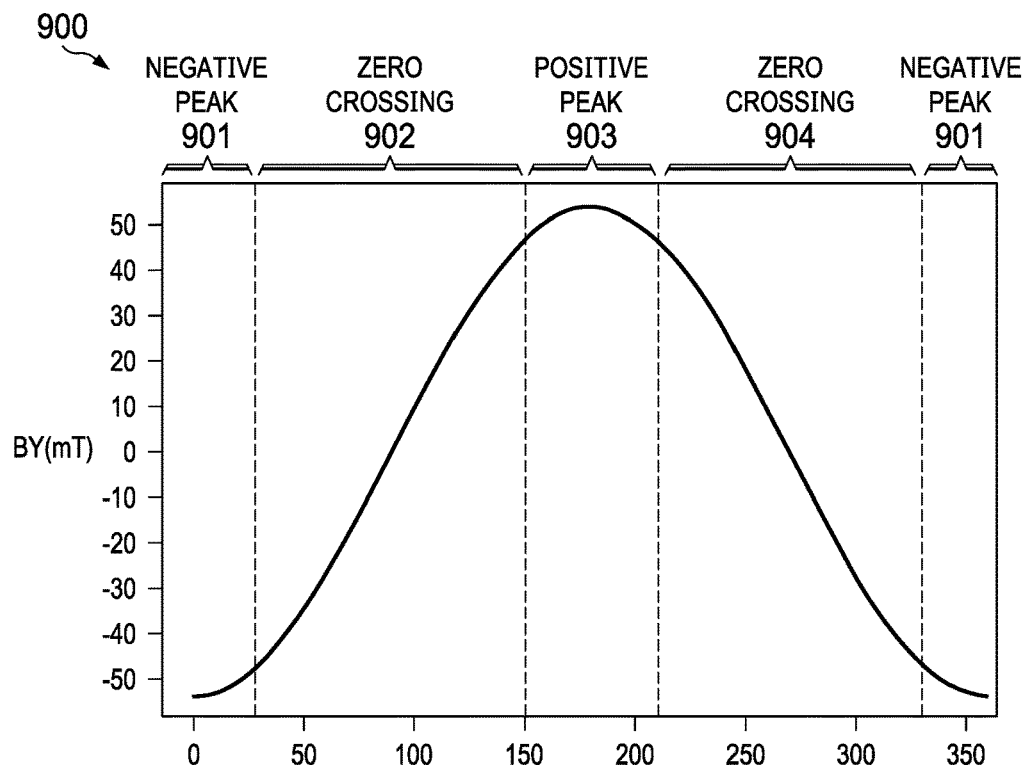
FIG. 9 is a graph of magnetic flux density along the orthogonal second direction as a function of the rotational angle of the rotary magnet showing example angular offset regions.

At 203, the method 200 includes wafer start initialization, executed once per tested wafer 101 with the wafer 101 positioned in an X-Y wafer plane. The initialization in one example includes measuring a probe needle height dz at 204 along the third direction Z, for example, using the camera 114. At 205, the controller 120 rotates the permanent magnet 107 and uses the onboard magnetic sensor 113 (e.g., one or more hall sensors) to measure the magnetic flux density B at each rotational angle $\theta$ to measure the magnetic field of the rotary magnet 107. In one example, the magnetic flux density is measured at 1° intervals, for a full 360° rotation of the rotary magnet 107. At 206, the controller 120 calculates and removes any constant vertical offsets from the measurement array. At 207, the controller calculates or otherwise determines an angular offset $\theta_{OFFSET}$ (e.g., 132 in FIG. 1) for each of multiple respective angular regions of the rotation of the rotary magnet 107 for each direction X, Y and Z. FIGS. 8 and 9 illustrate respective angular regions for the X and Y direction magnetic flux density in one example. At 208, the controller 120 calculates a multiplier factor b as a ratio between the modeling data and the measured magnetic flux density of the magnetic sensor 113 at the respective different rotational angles $\theta$.

At 210, the wafer probe testing begins, and the controller 120 operates the chuck positioner 103 at 212 to move the wafer chuck 102 relative to the probe card 106 to engage the probe needles 112 with a selected set or array 104 of the test sites 105 of the installed wafer 101. At 214, the controller operates a motor of the rotary magnet 107 to start or continue rotation of the rotary magnet 107. While the rotary magnet 107 rotates at 214, the controller 120 concurrently tests the magnetic sensing performance of circuits of the 30 respective probe sites 105 of the wafer 101 according to measured magnetic flux density signals or values from the magnetic sensor 113 and according to the model 126 at the respective test sites 105 of the wafer 101 as a function of the rotational angle θ of the rotary magnet 107 and the probe needle height dz. The controller 120 uses the model 126, as well as the angular offset $\theta_{OFFSET}$, the slope mz, the probe needle height dz and the computed multiplier factor b from the wafer start initialization at 203 to assess the magnetic performance of the circuits of the tested wafer probe test sites 105. The controller 120 in this example computes the magnetic flux density B for each of the X, Y and Z directions at each of the test sites 105 as $B=b*[B_{nominal}(\theta+\theta_{OFFSET})+B_{change}(\theta,z)]=b*[\beta0+\beta1\ \sin(\theta)+\beta2\ \cos(\theta)+mz(\theta+\theta_{OFFSET})*dz]$. β0, β1 and β2 are the regression model parameters based on the system characterization at 201, θ is the rotational angle of the rotary magnet 107, mz is the slope determined during the wafer start initialization as a function of the rotational angle θ, and dz is the probe needle height measured during wafer start initialization using the camera 114. In another implementation, the regression model 126 compensates for vertical offsets along the third direction Z, and computes the magnetic flux density B for each of the X, Y and Z directions at each of the test sites 105 as $B=b*[B_{nominal}(\theta+\theta_{OFFSET})+B_{change}(\theta,Z)]vo=b*[\beta0+\beta1\ \sin(\theta)+\beta2\ \cos(\theta)+mz(\theta+\theta_{OFFSET})*dz]*vo$, where vo is the vertical offset determined at 206 in FIG. 2 during wafer start initialization of each installed wafer 101. The use of the regression model 126 and the parameters 128 significantly reduces the computation time during testing at 210. In another implementation, the model 126 uses a lookup table (LUT 129 in FIG. 1) to determine the magnetic flux density B during the wafer probe testing at 214.

In one example, the rotational speed of the rotary magnet 107 is controlled to provide a desired magnetic field strength for testing the circuits of the test sites 105, and the rotary magnet 107 rotates only a fraction of a full rotation (e.g., less than 360°) during individual touchdown operations to test the circuits of an array 104 of 30 test sites 105. At a given test site 105, the X and Y direction magnetic flux density amplitudes and polarity will vary as a generally sinusoidal signal as a function of the rotational angle θ of the rotary magnet 107. The controller 120 determines the rotational angle θ of the rotary magnet 107 in one implementation by detecting peaks, valleys, and/or zero crossings of the magnetic flux density in either or both X and/or Y directions during wafer probe testing at 214 based on the in-line magnetic flux density measurements of the magnetic sensor 113.

In one implementation, the circuits of the individual test sites 105 include Hall sensor-based relays, and the controller 120 probes switching circuit nodes of the individual circuits to detect actuation of the respective relay circuits during wafer probe testing at 214. In this example, the controller 120 determines the pass or fail condition 130 according to the toggle angles at which the respective circuits switch from a first state to a second state in response to the magnetic field of the rotary magnet 107. Once the pass or fail conditions 130 are determined and stored in the memory 122 for the probed array of 30 test sites 105, the process 200 returns to 212 and the controller 120 changes the position of the probe card 106 relative to the wafer 101 to position the probe head 110 relative to the wafer chuck 102 and engage the probe needles 112 with the next 104 of test sites 105. The wafer probe testing 210 continues in this fashion until all desired test sites 105 have been probed and the test results are stored in the electronic memory 122. Following completion of the wafer probe testing at 210 of a given wafer 101, the wafer 101 is singulated to separate individual test sites 105 into respective semiconductor dies, and the singulated dies that pass the wafer probe testing at 210 are then packaged to provide integrated circuit products.

In another aspect, the electronic memory 122 of the controller 120 in FIG. 1 provides a non-volatile computer-readable medium 122 with computer-executable instructions which, when executed by the processor 121 cause the processor 121 to implement the wafer probe testing of the method 200.

Referring also to FIGS. 3 and 4, FIG. 3 shows a three-dimensional model 300 of the wafer probe test system with the rotary magnet 107, the on-board or in-line magnetic sensor 113 and the relative positioning of the multi-site probe array 104 having 30 test sites. FIG. 4 shows a probed portion 104 of a tested wafer with 30 concurrently probed test sites 105 arranged in 5 rows of 6 test sites 105. Another implementations, any suitable set of probed sites can be concurrently tested, and the configuration of the probe needles 112 on the probe head 110 can be tailored to a given probe area, which can be a rectangular array 104 as illustrated in FIGS. 1, 3 and 4, or can be of a different shape and include a different number of test sites 105.

Figure 5:
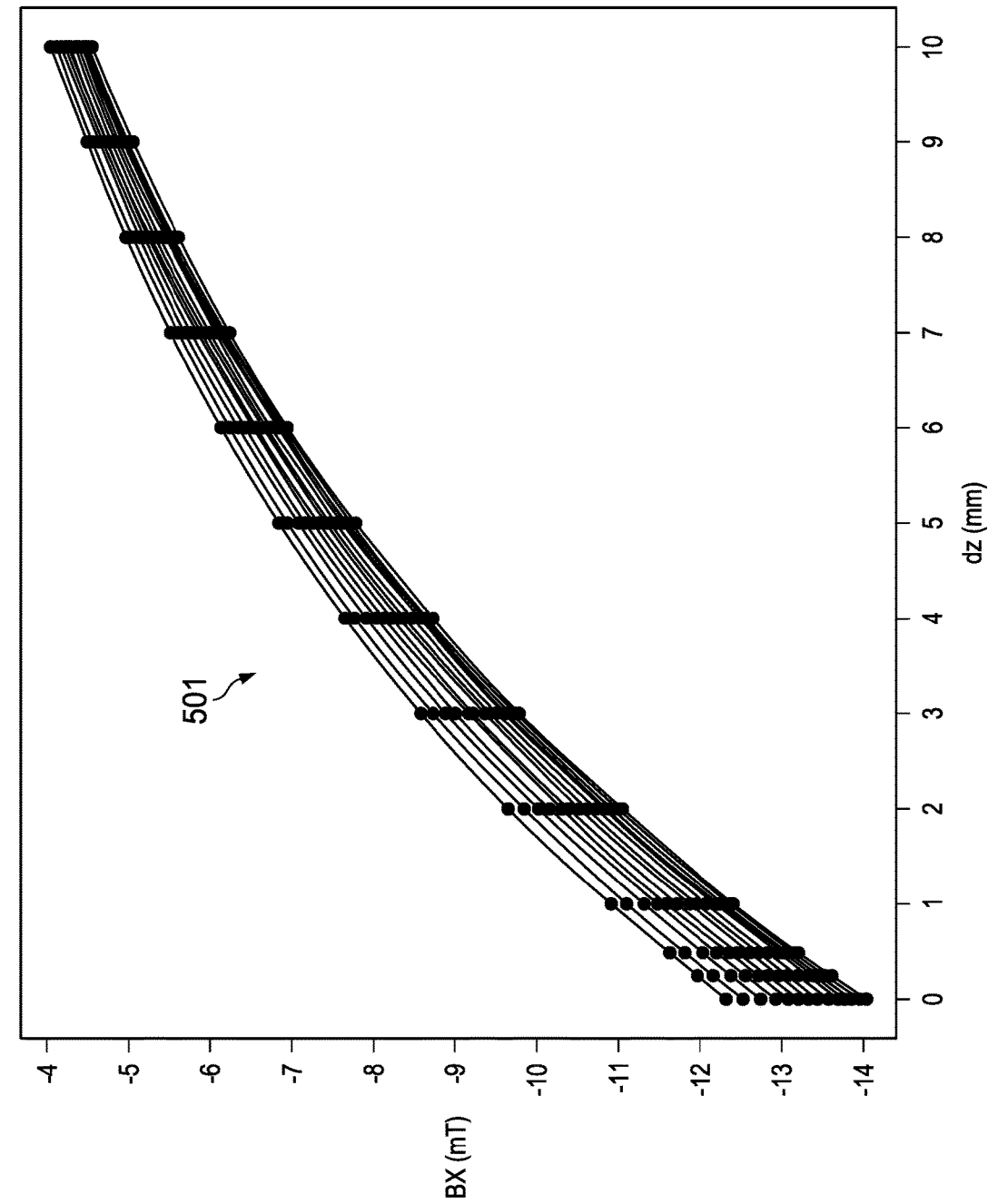
FIG. 5 is a graph of magnetic flux density along a first direction over a range of wafer probe height in the wafer probe test system.
Figure 6:
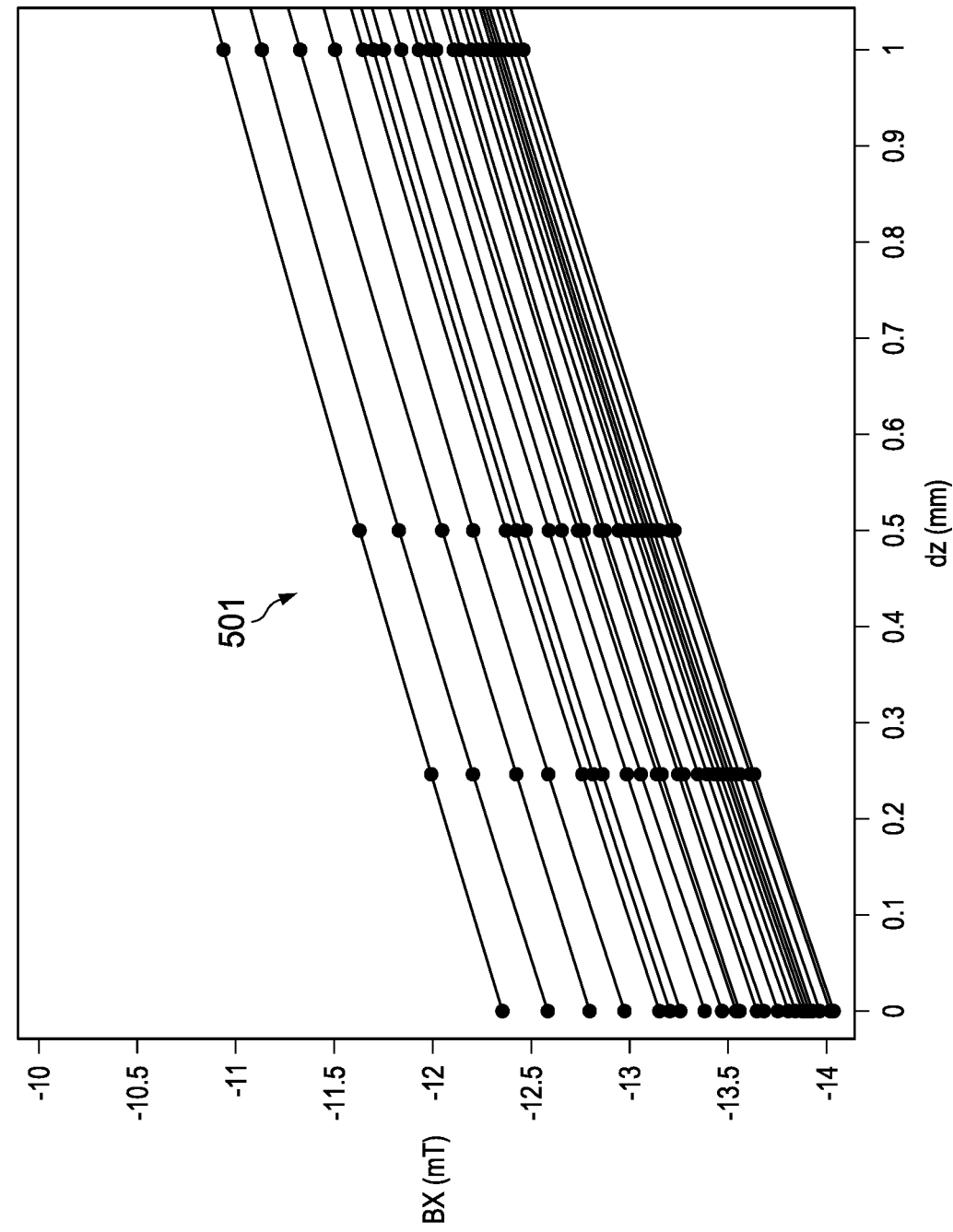
FIG. 6 is a graph of magnetic flux density along a first direction over a smaller range of wafer probe height in the wafer probe test system.
Figure 7:
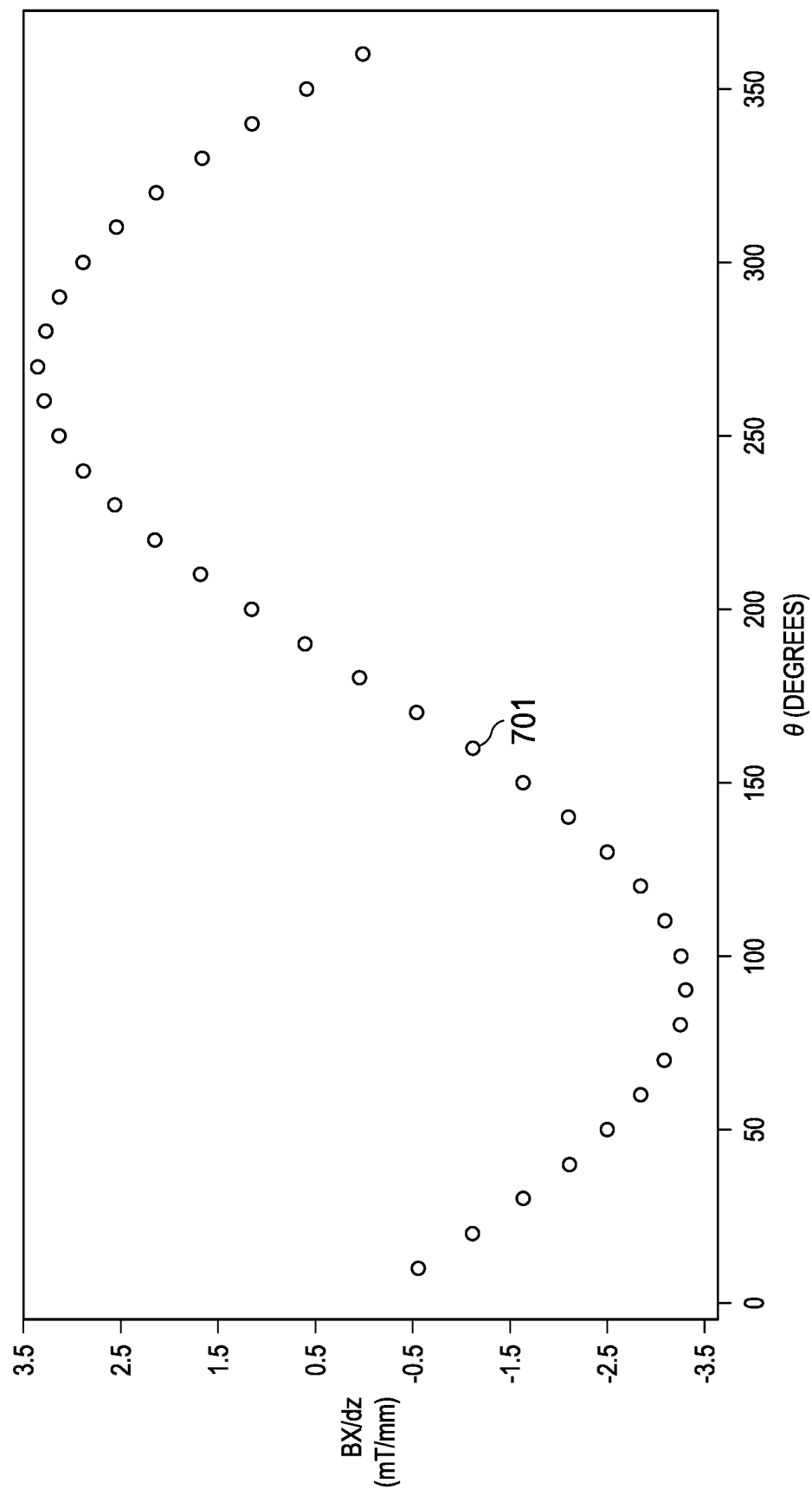
FIG. 7 is a graph of magnetic flux density slope change as a function of the rotational angle of the rotary magnet.

Referring now to FIGS. 5-7, FIG. 5 shows a graph 500 of magnetic flux density curves 501 for 30 concurrently engaged test sites 105 of the wafer 101. The curves 501 show the magnetic flux density BX along the first direction (e.g., X) over a 10 mm range of wafer probe height dz in the wafer probe test system 100. Over this relatively large probe height range, the magnetic flux density BX varies nonlinearly (e.g., sinusoidally). FIG. 6 shows a graph 600 of the curves 501 showing the X direction magnetic flux density BX along the first direction over a smaller 1 mm range of the wafer probe height dz, over which range the flux density BX varies generally linearly. In one implementation, a small, generally linear range of DZ is used during the system characterization at 201 in FIG. 2 to determine the slope mz to characterize the magnetic flux density change as a function of the wafer probe height dz measured by the camera 114. Similar techniques are used with respect to the magnetic flux density modeling for the second direction (e.g., Y).

FIG. 7 shows a graph 700 with a curve 701 formed by discrete plotted points of magnetic flux density slope change (BX/dz in mT/mm) along the first direction X as a function of the rotational angle of the rotary magnet. In this example, the magnetic flux density model 126 characterizes a linear relationship between BX and the wafer probe height dz when dz is less than or equal to 1 mm for a given test site 105 at a given rotational angle θ of the rotary magnet 107. The slope (mz (θ) in mT/mm) due to Z-direction height change is a function of the rotational angle θ of the rotary magnet 107. The modeled magnetic flux density change $Bchange=mz(\theta)*dz=[\beta0+\beta1*\sin(\theta)+\beta2*\cos(\theta)]*dz$, where mz is the slope and dz is the height change of the wafer probe needles 112. In one example, the linear approximation of the slope over a small enough range of dz facilitates calibration for a small delta (e.g., 3.5%) in the probe needle height dz from one touchdown to another at wafer probe testing to accommodate any setup variations of the system 100 in use. In one example, the modeling is done in increments of 1 angular degree of the rotational angle θ. For this example, the regression for modeling magnetic flux density B in the three orthogonal directions X, Y and Z involves storing three regression equation coefficients β0, β1 and β2 for each test site 105 and for each angular increment and provides the regression model 126 to reduce 32,400 values (e.g., 1 floating number per degree; 360*30 sites*3 components=32,400) to 270 regression model parameters 128 in the memory 122. More angle resolution would drive more data and vice versa. In one example, the regression involves sinusoidal modeling, in which a=sin(θ) and b=cos (θ), and the magnetic flux density in each of the respective directions X, Y and Z has a response of β0+β1a+β2b, with modeling in regression for 3 coefficients*30 sites*3 components=270 data entries for the parameters 128 (β0, β1 and β2).

Referring also to FIGS. 8 and 9, FIG. 8 shows a graph 800 of magnetic flux density BX along the first direction X as a function of the rotational angle θ of the rotary magnet 107 showing example angular offset regions 801 (300 to 60 degrees), 802 (60 to 120 degrees), 803 (120 to 240 degrees and 804 (240 to 300 degrees). FIG. 9 shows a graph 900 of magnetic flux density BY along the orthogonal second direction Y as a function of the rotational angle θ of the rotary magnet 107, including example angular offset regions 901 (330 to 30 degrees), 902 (30 to 150 degrees), 903 (150 to 210 degrees) and 904 (210 to 330 degrees). In one implementation, the angular offset values 132 ($\theta_{OFFSET}$) are determined during wafer start initialization at 207 in FIG. 2 for the various regions 801-804 and 901-904 for the respective first and second directions, and the controller stores the angular offset values 132 ($\theta_{OFFSET}$) in the memory 122.

Figure 10:
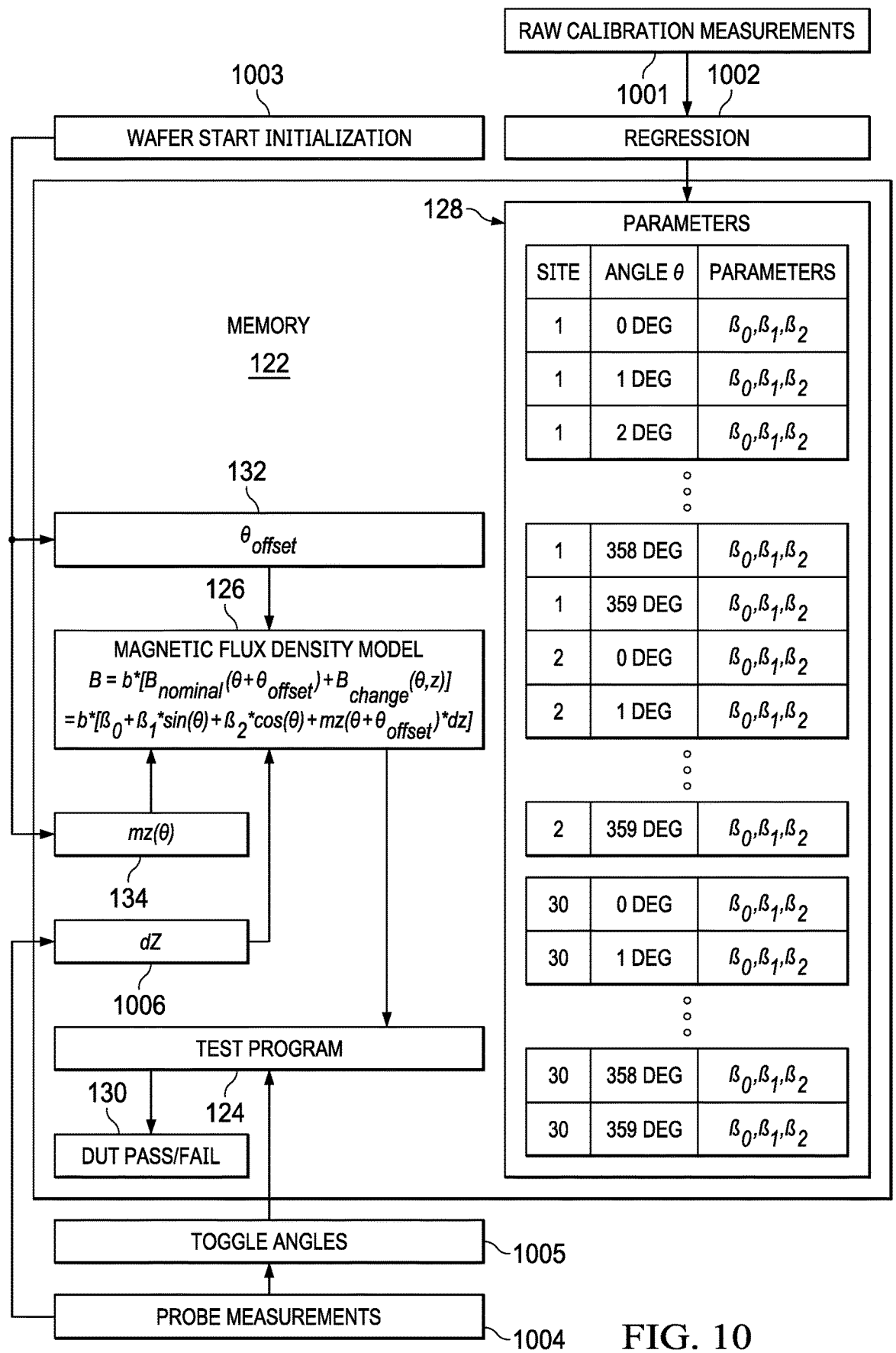
FIG. 10 is a schematic diagram of example memory parameters in the wafer probe test system.

FIG. 10 shows example memory parameters 128 and other data storage and organization in one example of the electronic memory 122 of the controller 120. Raw calibration measurements at 1001 are provided to the regression modeling 1002 (e.g., at 201 and 202 in the method 200 of FIG. 2 above), which populates the model parameters 128 (β0, β1 and β2). The wafer start initialization 1003 (e.g., 203 in FIG. 2) provides one or more angular offset values 132 ($\theta_{OFFSET}$) and one or more slope values 134 (mz(θ)) for each successively tested wafer 101. Probe measurements 1004 from the probe card 106 provide toggle angles 1005 during wafer probe testing of individual arrays 104 of test sites 105 and provide the probe needle height dz 1006 along the third direction Z during wafer start initialization. In this example, the probe card 106 provides the indications of state changes in the tested circuits to the controller 120, and the test program 124 correlates the corresponding toggle angles 1005 to flux densities at which the circuits toggled from a first state to a second state in response to the magnetic field of the rotary magnet 107. The processor 121 compares the toggles density values to corresponding pass or fail thresholds or ranges to determine the pass or fail condition 130 and stores the pass/fail results 130 in the memory 122.

Figure 11:
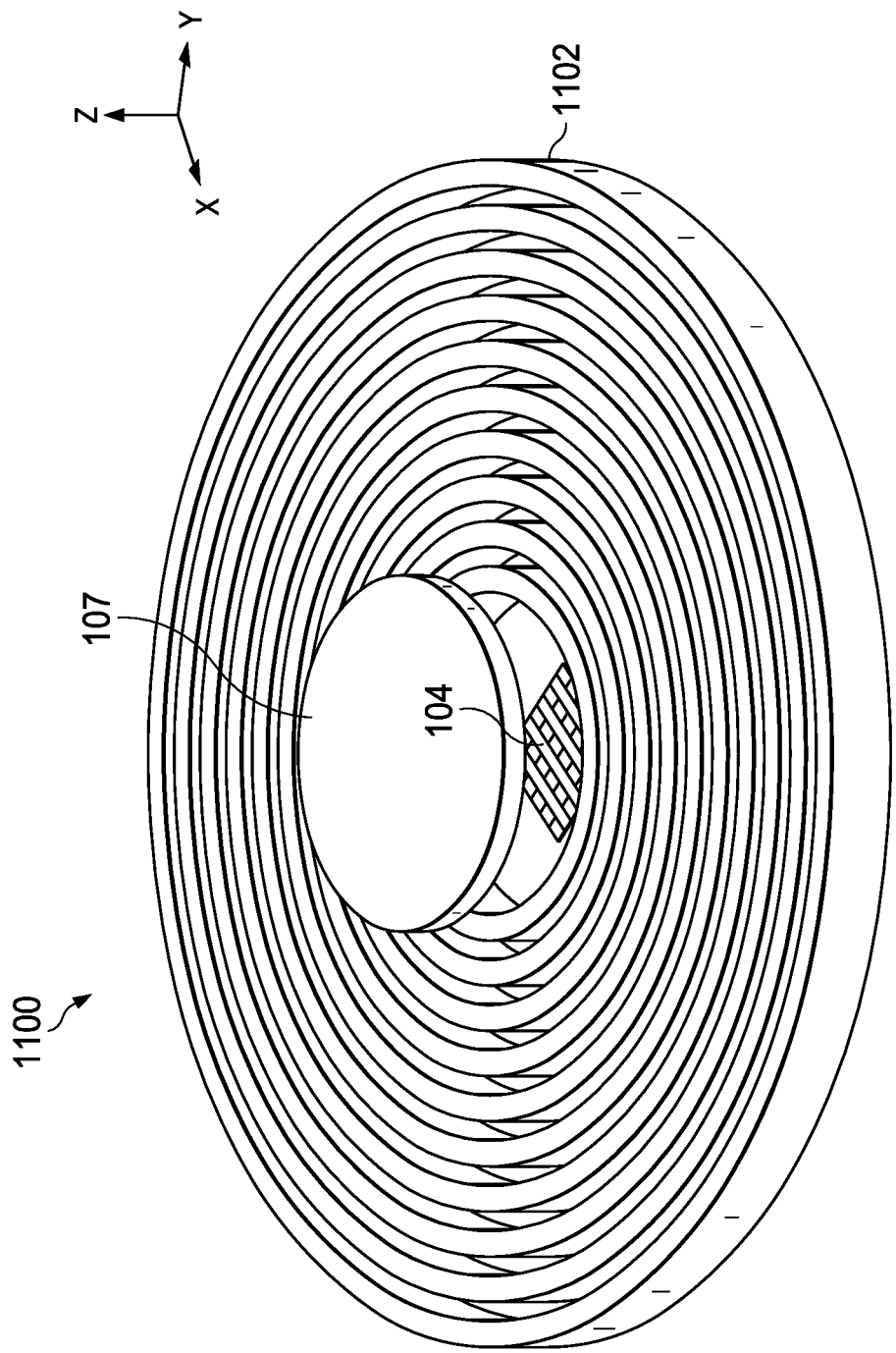
FIG. 11 is a simplified perspective view of a modeled wafer probe test system with a rotary magnet, an on-board or in-line magnetic sensor, a coil in the probe card and a multi-site probe head.
Figure 12:
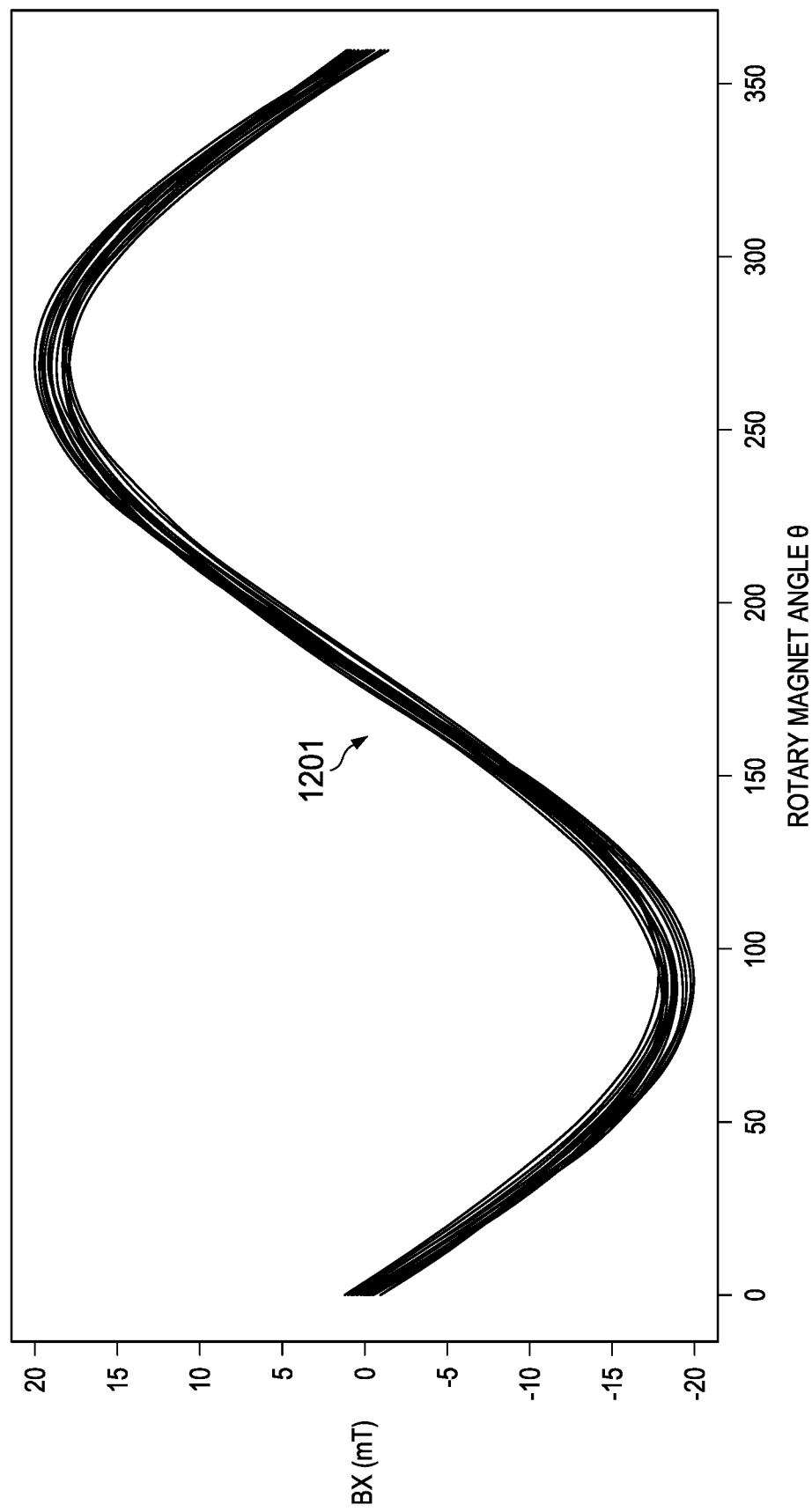
FIG. 12 is a graph of magnetic flux density for 30 test sites along a first direction over a 360-degree rotation of the rotary magnet.
Figure 13:
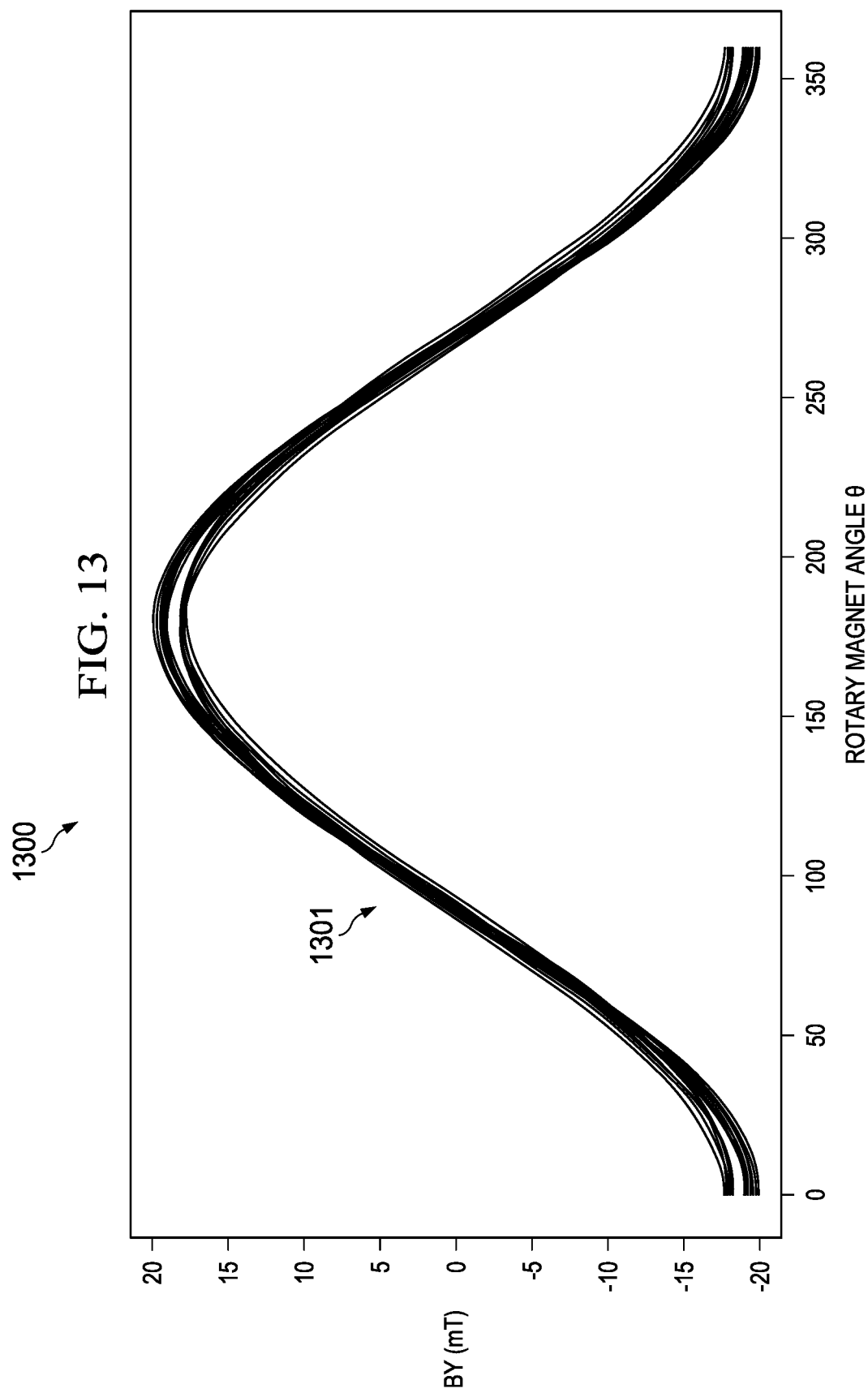
FIG. 13 is a graph of magnetic flux density for 30 test sites along a second orthogonal direction over a 360-degree rotation of the rotary magnet.
Figure 14:
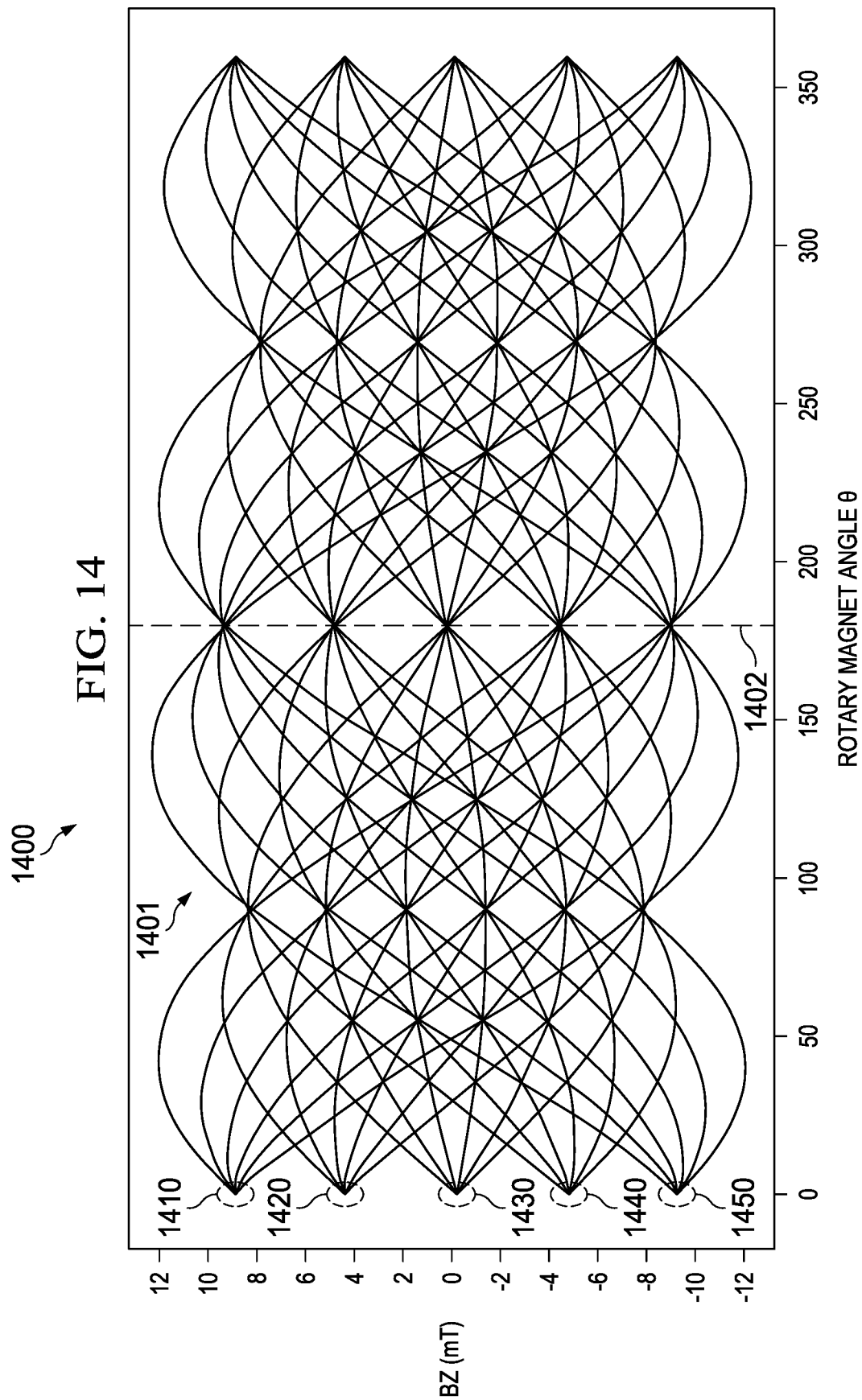
FIG. 14 is a graph of magnetic flux density for 30 test sites along a third orthogonal direction over a 360-degree rotation of the rotary magnet.

Referring now to FIGS. 11-14, FIG. 11 shows a modeled wafer probe test system 1100 with the rotary magnet 107, the on-board or in-line magnetic sensor, a band coil 1102 in or on the probe card 106 of FIG. 1, and a multi-site probe head as described above. FIG. 12 shows a graph 1200 of with 30 curves 1201 that illustrate magnetic flux density BX for the example 30 test sites 105 in the array 104 along the first direction X over a 360-degree rotation of the rotary magnet 107. FIG. 13 shows a graph 1300 of with 30 curves 1301 that illustrate magnetic flux density BX for the example 30 test sites 105 in the array 104 along the second direction Y over a 360-degree rotation of the rotary magnet 107. FIG. 14 shows a graph 1400 of with 30 curves 1401 that illustrate magnetic flux density BX for the example 30 test sites 105 in the array 104 along the second direction Y over a 360-degree rotation of the rotary magnet 107. The curves 1401 in FIG. 14 are illustrated in five groups 1410, 1420, 1430, 1440 and 1450 corresponding to the respective rows of test sites 105 in the example array 104.

For the magnetic flux densities BX and BY along the respective first and second directions, the system 1100 exhibits sinusoidal flux density B as a function of the rotational angle θ of the rotary magnet 107 for the 30 probed test sites 105 of the probe array 104, as shown by the respective curves 1201 and 1301 in FIGS. 12 and 13. This facilitates fast wafer probe testing during rotation of the rotary magnet 107 within a small angle range to toggle magnetic switch/latch devices of the probed test sites 105. The use of the rotary magnet 107 alone for testing circuit response to magnetic flux density BZ along the third direction Z may, however, require rotation of the rotary magnet 107 through the entire 360-degree range, which can significantly increase testing time and increase production cost.

In another example, the probe card 106 of FIG. 1 includes a band coil 1102 in an X-Y plane as shown in the modeled system 1100 of FIG. 11. In one example, the windings of the band coil 1102 are integrated into one or more layers of the PCB structure of the probe card 106 shown in FIG. 1. The band coil 1102 is positioned in the system 1100 below the rotary magnet 107 and above the wafer 101 during testing, and the controller 120 controls a current flowing in the coil 1102 to generate a magnetic field in the third direction Z. As shown in FIG. 14, when the rotary magnet 107 is positioned in this fashion (e.g., at an angle of approximately 180° shown by line 1402), the Z-direction magnetic flux density is approximately equal for each of the tested circuits in the respective test sites 105 of a given one of the rows 1410, 1420, 1430, 1440 and 1450. The combination of the energized coil 1102 with rotation of the rotary magnet 107 during testing for BX, BY and BZ performance of the tested circuitry, the rotary magnet 107 still presents potentially large site to site variation. Removing the rotary magnet 107 for BZ response measurement is impractical as significantly increasing test time.

The modeling in one example accommodates the composite effect of the combination of the energized coil 1102 with rotation of the rotary magnet 107, for example, by effectively dividing the tested array 104 of test sites 105 along the first direction X (e.g., test sites 105 above and sites 105 below the X direction) with the rotary magnet stationary with one pole 108 above the X axis and the other pole 109 below the axis or vice versa. In this condition, with the coil 1102 deenergized, the test sites 105 within the same row have almost the same BZ (mT), and controller 120 uses the model 126 to calculate BZ from the rotary magnet 107, and the controller 120 energizes the coil 1102 with an increasing current level until the coil current is identified at which the equal but opposite field from the band coil 1102 cancels out the field from stationary rotary magnet 107. The controller 120 then adds additional coil current to generate BZ to toggle the outputs of the hall sensors latches/switches of the test sites 105 and performs the pass or fail evaluation as described above based on the toggle angles (e.g., 1005 in FIG. 10) and stores the pass or fail results 130 in the memory 122. In one implementation, the controller 120 controls the current flowing in the coil 1102 and operation of the rotary magnet 107 to test the magnetic performance response of the tested circuitry to magnetic field along the third direction Z, for example, using the band coil 1102 to generate an equal but opposite field in the third direction Z to cancel out the field from the rotary magnet 107 and to increase/decrease the coil current to determine the pass/fail condition of the tested circuits in the test sites 105 of the wafer 101.

Figure 15:
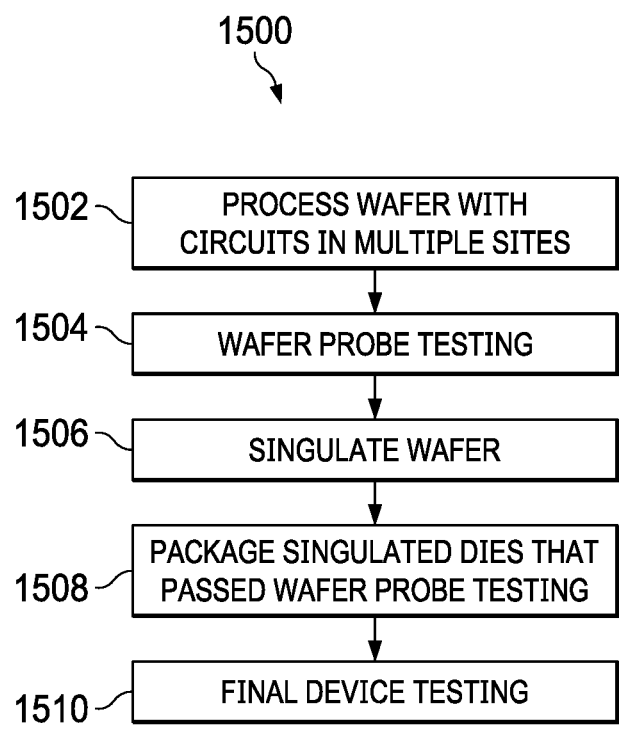
FIG. 15 is a flow diagram of a method of fabricating a packaged electronic device with wafer probe testing using the model and system of FIG. 1.

FIG. 15 shows a method 1500 of fabricating a packaged electronic device with wafer probe testing according to the method 200 described above using the model 126 and wafer probe test system 100 of FIG. 1. The method 1500 begins at 1502 with wafer processing to fabricate a wafer (e.g., wafer 101 in FIG. 1 above) with magnetic circuits in multiple respective die areas (e.g., test sites 105 in FIG. 1 above). The method 1500 also includes wafer probe testing at 1504. In one example, the wafer probe testing at 1504 is as shown and described above in connection with 210 of FIG. 2. Following wafer probe testing at 1504, the tested wafer is separated or singulated at 1506 to separate individual test sites 105 into respective semiconductor dies. The singulated passing dies are packaged at 1508 to form packaged electronic devices (e.g., packaged integrated circuits or ICs). In one example, the packaged electronic devices undergo final testing at 1510.

The described wafer probe test methods and systems facilitate accurate, repeatable and cost-effective testing of wafer level magnetic circuitry using model-based performance evaluation that accommodates system variations that affect applied magnetic field levels and direction for concurrently testing multiple test sites 105 of the wafer 101. The model is used to account for thermal variations as well as mechanical variations in system components, such as probe needle height and a rotary magnet 107 is used alone or in combination with a magnet coil 1105 to test performance of magnetic sensing circuitry, such as Hall sensors or Hall-based sensor latches/switches using a high-speed wafer probe test system in which temperature fluctuates, rotary magnets are changed, probe needles wear out and/or magnet source position and strength change over time and between touchdowns. The described solutions provide in-line wafer probe testing with reduced manufacturing setup complexity by avoiding or mitigating the time engineers spend to characterize probe hardware and set different limits for different probe hardware and avoids requirements for maintaining and updating a calibration table in a given production environment.

Modifications are possible in the described examples, and other implementations are possible, within the scope of the claims.

What is claimed is:

1. A method of manufacturing an electronic device, the method comprising:
   initializing a wafer probe test system to test a wafer that is positioned in a wafer plane of orthogonal first and second directions, including:
      measuring a probe needle height along a third direction that is orthogonal to the first and second directions, and
      using a magnetic sensor of the wafer probe test system, measuring a magnetic field of a rotary magnet rotating about an axis along the third direction at different rotational angles; and
   while the rotary magnet rotates, testing magnetic sensing performance of circuits of respective test sites of the wafer according to a model of magnetic flux density in the first, second and third directions at the respective test sites of the wafer as a function of the rotational angle of the rotary magnet, the probe needle height and measured magnetic flux density of the magnetic sensor.

2. The method of claim 1, wherein:
   initializing a wafer probe test system further comprises determining an angular offset for respective angular regions of the rotation of the rotary magnet; and
   the magnetic sensing performance of the circuits of respective test sites of the wafer is tested according to the model, the probe needle height, the measured magnetic flux density of the magnetic sensor, and the angular offset.

3. The method of claim 2, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

4. The method of claim 1, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

5. The method of claim 1, further comprising:
   modeling magnetic flux density at the test sites of the wafer and the magnetic sensor of the wafer probe test system of a nominal design and setup variations of the rotary magnet rotating about the axis at the respective different rotational angles; and
   developing the model of magnetic flux density in the first, second and third directions at the respective test sites of the wafer as a function of the rotational angle of the rotary magnet, the probe needle height and the measured magnetic flux density of the magnetic sensor according to the modeling of the magnetic flux density at the test sites of the wafer and the magnetic sensor of the wafer probe test system.

6. The method of claim 5, wherein the model is developed as a regression model of magnetic flux density at the test sites of the wafer.

7. The method of claim 5, wherein modeling magnetic flux density at the test sites of the wafer and the magnetic sensor of the wafer probe test system includes using a three-dimensional solver to model the magnetic flux density at the test sites of the wafer and the magnetic sensor of the wafer probe test system of the nominal design and the setup variations.

8. The method of claim 1, further comprising:
   controlling a current flowing in a band coil having turns in a plane of the first and second directions to generate a magnetic field in the third direction that cancels a magnetic field of the rotary magnet in the third direction.

9. A method of manufacturing an electronic device, the method comprising:
   initializing a wafer probe test system to test a wafer that is positioned in a wafer plane of orthogonal first and second directions, including:
      measuring a probe needle height along a third direction that is orthogonal to the first and second directions,
      using a magnetic sensor of the wafer probe test system, measuring a magnetic field of a rotary magnet rotating about an axis along the third direction at different rotational angles;
      calculating a multiplier factor as a ratio between modeling data and measured magnetic flux density of the magnetic sensor at the respective different rotational angles; and
      determining an angular offset for respective angular regions of the rotation of the rotary magnet; and
   while the rotary magnet rotates, testing magnetic sensing performance of circuits of respective test sites of the wafer according to a model of magnetic flux density in the first, second and third directions at the respective test sites of the wafer as a function of the rotational angle of the rotary magnet, the probe needle height and the measured magnetic flux density of the magnetic sensor, and the angular offset;

wherein the model of magnetic flux density at the test sites of the wafer is a regression model having model parameters for magnetic flux density in the first, second and third directions as a function of the rotational angle of the rotary magnet for each of the respective test sites of the wafer; and wherein testing the magnetic sensing performance of the circuits of the respective test sites of the wafer comprises calculating magnetic flux density at the respective test sites of the wafer as a function of the rotational angle of the rotary magnet, the probe needle height, the measured magnetic flux density of the magnetic sensor, the angular offset and the multiplier factor.

10. The method of claim 9, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

11. A method of manufacturing a packaged electronic device, the method comprising:
fabricating circuits on or in respective test sites of a wafer;
wafer probe testing the test sites of the wafer, including:
initializing a wafer probe test system to test the wafer that is positioned in a wafer plane of orthogonal first and second directions, including:
measuring a probe needle height along a third direction that is orthogonal to the first and second directions, and
using a magnetic sensor of the wafer probe test system, measuring a magnetic field of a rotary magnet rotating about an axis along the third direction at different rotational angles; and
while the rotary magnet rotates, testing magnetic sensing performance of the circuits of the respective test sites of the wafer according to a model of magnetic flux density in the first, second and third directions at the respective test sites of the wafer as a function of the rotational angle of the rotary magnet, the probe needle height and the measured magnetic flux density of the magnetic sensor;
separating the respective test sites from one another to provide separated semiconductor dies; and
packaging at least some of the separated semiconductor dies to form packaged electronic devices.

12. The method of claim 11, wherein testing the magnetic sensing performance of the circuits of the respective test sites of the wafer comprises determining a pass or fail condition of the circuits of the respective test sites of the wafer according to respective toggle angles at which the respective circuits switch from a first state to a second state in response to the magnetic field of the rotary magnet.

13. The method of claim 11, wherein:
initializing a wafer probe test system further comprises determining an angular offset for respective angular regions of the rotation of the rotary magnet; and
the magnetic sensing performance of the circuits of respective test sites of the wafer is tested according to the model, the probe needle height, the measured magnetic flux density of the magnetic sensor, and the angular offset.

14. The method of claim 12, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

15. The method of claim 11, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

16. The method of claim 11, further comprising:
modeling magnetic flux density at the test sites of the wafer and the magnetic sensor of the wafer probe test system of a nominal design and setup variations of the rotary magnet rotating about the axis at the respective different rotational angles; and
developing the model of magnetic flux density in the first, second and third directions at the respective test sites of the wafer as a function of the rotational angle of the rotary magnet, the probe needle height and the measured magnetic flux density of the magnetic sensor according to the modeling of the magnetic flux density at the test sites of the wafer and the magnetic sensor of the wafer probe test system.

17. The method of claim 16, wherein the model is developed as a regression model of magnetic flux density at the test sites of the wafer.

18. The method of claim 16, wherein modeling magnetic flux density at the test sites of the wafer and the magnetic sensor of the wafer probe test system includes using a three-dimensional solver to model the magnetic flux density at the test sites of the wafer and the magnetic sensor of the wafer probe test system of the nominal design and the setup variations.

19. The method of claim 11, further comprising:
controlling a current flowing in a band coil having turns in a plane of the first and second directions to generate a magnetic field in the third direction that cancels a magnetic field of the rotary magnet in the third direction.

20. A method of manufacturing a packaged electronic device, the method comprising:
fabricating circuits on or in respective test sites of a wafer;
wafer probe testing the test sites of the wafer, including:
initializing a wafer probe test system to test the wafer that is positioned in a wafer plane of orthogonal first and second directions, including:
measuring a probe needle height along a third direction that is orthogonal to the first and second directions;
using a magnetic sensor of the wafer probe test system, measuring a magnetic field of a rotary magnet rotating about an axis along the third direction at different rotational angles;
calculating a multiplier factor as a ratio between modeling data and the measured magnetic flux density of the magnetic sensor at the respective different rotational angles;
determining an angular offset for respective angular regions of the rotation of the rotary magnet; and
while the rotary magnet rotates, testing magnetic sensing performance of the circuits of the respective test sites of the wafer according to a regression model of magnetic flux density in the first, second and third directions as a function of the rotational angle of the rotary magnet, the probe needle height, measured magnetic flux density of the magnetic sensor; and the angular offset; and wherein the testing comprises calculating magnetic flux density at the respective test sites of the wafer as a function of the rotational angle of the rotary magnet, the probe needle height, the measured magnetic flux density of the magnetic sensor, the angular offset and the multiplier factor;

separating the respective test sites from one another to provide separated semiconductor dies; and packaging at least some of the separated semiconductor dies to form packaged electronic devices.

21. The method of claim 20, wherein testing the magnetic sensing performance of circuits of respective test sites of the wafer comprises determining a pass or fail condition of the circuits of the respective test sites of the wafer according to respective toggle angles at which the respective circuits switch from a first state to a second state in response to the magnetic field of the rotary magnet.

22. A method of manufacturing an electronic device, the method comprising:

measuring a probe needle height along a first direction;

measuring a magnetic field of a rotary magnet rotating about an axis along the first direction at different rotational angles; and while the rotary magnet rotates, testing magnetic sensing performance of circuits of respective test sites of a wafer according to a model of magnetic flux density in the first and at least one additional direction at the respective test sites of the wafer as a function of the rotational angle of the rotary magnet, the probe needle height and measured magnetic flux density of the magnetic sensor.

\* \* \* \* \*